United States Patent [19]

Wald et al.

[11] Patent Number: 5,279,682
[45] Date of Patent: Jan. 18, 1994

[54] SOLAR CELL AND METHOD OF MAKING SAME

[75] Inventors: Fritz Wald, Wayland; Jacob Murad, Somerville, both of Mass.

[73] Assignee: Mobil Solar Energy Corporation, Billerica, Mass.

[21] Appl. No.: 994,763

[22] Filed: Dec. 22, 1992

Related U.S. Application Data

[63] Continuation of Ser. No. 713,688, Jun. 11, 1991, abandoned.

[51] Int. Cl.⁵ .................. H01L 31/06; H01L 31/18; H01L 31/0224
[52] U.S. Cl. .......................... 136/256; 437/2; 437/181; 437/189; 437/195
[58] Field of Search .............. 136/256; 437/2-5; 437/180-181; 437/187-189, 195

[56] References Cited

U.S. PATENT DOCUMENTS 4,698,455  10/1987  Cavicchi ................. 136/256
5,084,107  1/1992   Deguchi et al. ........ 136/256

FOREIGN PATENT DOCUMENTS 62-156881  7/1987  Japan ................. 136/256
63-119273  5/1988  Japan ................. 136/256
63-119274  5/1988  Japan ................. 136/256

Primary Examiner—Aaron Weisstuch
Attorney, Agent, or Firm—Pandiscio & Pandiscio

[57] ABSTRACT

An improved solar cell of the type including a semiconductor substrate having a shallow p-n junction adjacent its front surface, a rear electrode affixed in adherent mechanical and electrical contact with the rear surface of the semiconductor substrate, and a front generally grid-shaped electrode including an array of narrow, elongate, parallel fingers and at least one bus bar extending at right angles to the fingers in electrical contact therewith affixed in mechanically adherent and low resistance electrical contact with the front surface of the semiconductor substrate. The improvement includes the removal of the bus bar portion of the front grid-shaped electrode from intimate mechanical and electrical contact with the front surface of the semiconductor substrate. The improvement increases the open circuit voltage and efficiency of the solar cell, and allows the bus bar portion of the grid shaped electrode to be formed of materials different from the finger portions of that electrode thereby providing cost advantages and design flexibility without detriment to solar cell efficiency. A method of making the improved solar cell also is disclosed.

21 Claims, 1 Drawing Sheet

SOLAR CELL AND METHOD OF MAKING SAME

This is a continuation of U.S. application Ser. No. 07/713,688 filed Jun. 11, 1991 for "Improved Solar Cell And Method Of Making Same, now abandoned.

BACKGROUND

1. Field of Invention

The present invention generally relates to photovoltaic cells. More particularly, the invention relates to a solar cell having an improved conductive front grid-shaped contact configuration, and a method of forming same.

2. Summary of the Prior Art

Photovoltaic cells essentially comprise a semiconductor substrate of one conductivity type having a shallow P-N junction formed adjacent the front surface thereof. The cells require electrical contacts (generally metallic in composition, and sometimes referred to as "electrodes") on both their front and rear surfaces in contact with the semiconductor substrate in order to be able to recover an electrical current from the cells when they are exposed to solar radiation. These contacts are commonly made of aluminum, silver or nickel. For example, a common arrangement with solar cells having a silicon substrate is to make the rear contact of aluminum and the front contact of silver.

The contact on the front surface of the cell is generally made in the form of a grid, comprising an array of narrow, elongate, parallel fingers that extend in one direction, and at least one elongate bus that intersects the fingers at a right angle. The width, number and arrangement of the fingers is such that the area of the front surface adapted for exposure to solar radiation is maximized. Further, in order to improve the conversion efficiency of the cells, it has been found beneficial to provide a thin anti-reflection coating of a material such as silicon nitride or an oxide of silicon or titanium on the front surface of the cells.

Solar cells formed utilizing a semiconductor substrate having a shallow P-N junction adjacent its front surface, with that surface being coated with an insulating coating such as silicon nitride, therefore, are well known in the art. Such substrates sometimes will be referred to hereinafter as "solar cell blanks". It will be understood by those skilled in the art that a typical solar cell blank might consist of an EFG-grown silicon substrate of p-type conductivity having a P-N junction located about 0.5 microns from its front surface, and having a silicon nitride coating about 800 Angstroms thick on its front surface. Equivalent solar cell blanks also are well known. For example, single crystal silicon substrates, cast polycrystalline substrates, epitaxial silicon on metallurgical grade silicon or fine grain polysilicon layers formed by chemical or physical vapor deposition, can all be used in the formation of a solar cell blank. Similarly, n-type as well as p-type material may be used, and shapes other than flat stock are permissible, e.g., a circular piece of material, or substrates having an arcuate or polygonal cross-section.

The rear surface contact is commonly formed by coating substantially the entire rear surface of a solar cell blank with an aluminum paste, and thereafter, heating the coated solar cell blank so as to alloy the aluminum with the silicon substrate. Normally, the aluminum coating covers the entire rear surface with the exception of a small area adjacent the periphery of the rear surface. The exterior surface of the aluminum tends to oxidize, however, thereby increasing the resistance of a soldered contact between the aluminum surface and a tab used to connect the solar cell electrically to adjacent solar cells or an external electrical circuit. Accordingly, it has been found useful additionally to leave apertures through the aluminum coating in the central portion of the rear surface area. A silver containing ink then is used to fill these apertures and slightly overlap the adjacent aluminum layer. These silver areas create locations for the attachment of the tabs to the rear contact of the solar cell which are more efficient than direct attachment to the aluminum.

The grid-shaped contact on the front surface has been formed in various ways. For example, in some cases the grid pattern is formed on the front surface by screen printing or some other technology, and thereafter fired to complete the alloying of the metal particles contained in the ink to the silicon substrate. The substrate with the grid pattern alloyed thereto is then coated with the anti-reflective coating. A more direct approach of first coating the semiconductor substrate with the anti-reflective coating, and thereafter applying the grid contact also has been utilized in the art. To accomplish the latter objective, portions of the anti-reflective coating have in some cases been etched away so as to expose portions of the front surface of the semiconductor substrate in the desired grid electrode pattern. Thereafter, the front contact is deposited or otherwise formed on the front surface in the region where the anti-reflective coating has been etched away.

Another approach to the formation of the front contact on a solar cell blank is the so-called "fired-through" method. That method consists of the following steps: (1) applying a coating of a metal/glass frit ink or paste to the front surface of a solar cell blank in a predetermined pattern corresponding to the configuration of the desired grid electrode, and (2) heating the coated solar cell blank at a temperature and for a time sufficient to cause the metal/glass composition to dissolve the anti-reflective coating and to form an ohmic contact with the underlying front surface of the semiconductor substrate. The "fired through" method of forming contacts is illustrated by PCT Patent Application Publication WO 89/12312, published 14 Dec. 1989, based on U.S. patent application, Ser. No. 205304, filed 10 Jun. 1988 by Jack Hanoka for an Improved Method of Fabricating Contacts for Solar Cells. The concept of firing metal contacts through an anti-reflection dielectric coating also is disclosed in U.S. Pat. No. 4,737,197, issued to Y. Nagahara et al. for "Solar Cell with Paste Contact".

The so-called "fired through" technique presupposes the use of thick film technology wherein a suitable paste or viscous ink forms a relatively thick metal-containing film on the solar cell blank which when fired will dissolve the anti-reflection coating and bond to the underlying silicon or other semiconductor. In U.S. patent application No. 666,334, filed 7 Mar. 1991 by Jack I. Hanoka and Scott E. Danielson entitled "Method and Apparatus for Forming Contacts", there is disclosed an improved method for direct writing such a thick ink film on the front surface of a solar cell blank or other substrate. In that method, the discharge orifice of the pen is located far enough above the moving surface of the solar cell blank that the pen does not contact the ink deposited on the blank. This in turn allows more efficient solar cell manufacturing operations, and the formation of finger contacts having greater aspect ratios (i.e., the ratio of finger height to finger width) than was theretofor possible. The resulting increase of finger height, without a corresponding increase in finger width, is desirable because the finger is thereby capable of carrying greater current without an increase in so-called "light shadowing" (i.e., the preclusion of solar radiation from reaching the front surface of the solar cell blank).

As alluded to above, the contact pattern on the front surface of the solar cell blank generally comprises at least one bus and an array of narrow, elongate, parallel fingers intersecting the bus at a right angle. This configuration optimizes the amount of radiant solar energy that can reach the front surface of the solar cell blank, while at the same time providing an efficient means to collect and transmit the current generated in the semiconductor substrate. Both the fingers and the bus have heretofore been alloyed directly to the semiconductor substrate. This is true both in the process wherein the grid contact is formed on the semiconductor front surface and later coated with an anti-reflective coating, and also in the process wherein the grid contact is formed on the front surface of a solar cell blank to directly contact the underlying semiconductor either through openings etched in the coating or by being fired through the coating. The resulting front grid-shaped electrode configuration has provided economy to the process because the entire metallization pattern (bus bars and fingers) can be printed at the same time in the same processing steps utilizing the same materials (generally metal containing inks).

Improvements to the electrical characteristics of the front solar radiation receiving sides of solar cells are constantly being sought in the art. Several of the better known ways to accomplish such improvements are the provision of better light trapping capability to the cell, reduction of the shadowing of the front surface of the solar cell blank by the grid pattern, and the reduction of both the ideal and non-ideal components of the emitter saturation current density at the front of the cell. The ideal emitter saturation current density is made up of three components: recombination in the emitter layer, recombination at the semiconductor/anti-reflective coating interface, and recombination at the metal/semiconductor interface. Significant increases in solar cell efficiencies will require reductions in all of the sources of recombination. In addition, advances in the art which will simplify manufacture and/or reduce costs without adverse effect upon presently attainable solar cell efficiency and/or life expectancy also are desirable.

SUMMARY OF THE INVENTION

Accordingly, it is an object of the invention to provide an improved front contact for a solar cell such that the recombination at the metal/semiconductor interface of the solar cell is reduced.

It is also an object of the invention to provide a solar cell having a front contact which is cost efficient to manufacture in terms of both manufacturing effort and material cost.

Further, it is an object of the invention to provide a solar cell having an improved (i.e., increased) open circuit voltage.

Still further, it is an object of the invention to provide a method for making an improved solar cell having an efficiency comparable to that of presently available solar cells with available capital equipment and at reduced cost.

These and other features and objectives of the invention are accomplished by the provision of a novel front contact configuration for a solar cell wherein the bus bar(s) are removed from intimate contact, with the semiconductor substrate and preferably is (are) made made of a different material than the remainder of the grid electrode. The novel solar cell of the invention therefore includes (1) a semiconductor substrate which has a shallow p-n junction adjacent its front surface; (2) a rear electrical contact in mechanically adherent and electrical contact with the rear surface of the substrate; (3) an array of narrow, elongate, parallel fingers of highly conductive material affixed at their rear surfaces in good, reliable, and low resistance electrical contact with the front surface of the semiconductor substrate; and (4) at least one bus bar of conductive material disposed at right angles to the fingers and in low resistance electrical contact with the front surfaces of each of the fingers. The material of the bus bar may be the same as that of the fingers. However, this is not required.

In a preferred case, the front surface of the semiconductor substrate is covered by a thin coating of an anti-reflective material such as silicon nitride. The fingers are made of a paste or viscous ink containing silver and glass frit particles fired at a heat and for a time sufficient for the glass frit to dissolve the anti-reflective coating and for the silver to make intimate contact with the underlying semiconductor substrate. The bus bar is formed of a selected paste or viscous ink or an epoxy composition containing particles of a conductive metal applied to the front surface of the anti-reflective coating at right angles to and contacting the fingers. Depending upon the nature of the material chosen for the bus bar, it may either be (a) affixed to the front surface of the anti-reflective coating adhesively, or (b) partially embedded in the anti-reflective layer to a depth less than the depth of that layer (i.e., such that the bus bar is held within the front surface of the anti-reflective layer but in spaced relation to the front surface of the semiconductor substrate). An epoxy will accomplish the first of these alternatives, as will a viscous ink or paste including appropriate binders. A viscous ink including glass frit will accomplish the latter alternative. However, care must be taken to assure that the fingers will dissolve the underlying anti-reflective coating allowing intimate contact between the finger material and the semiconductor substrate, while the bus bars will only dissolve the outer portion of the anti-reflective layer. The last mentioned distinction will be of paramount importance in those cases wherein the bus bar and finger configuration is to be fired at the same time and under the same conditions as will be discussed in more detail below.

The method of the invention includes the following steps: (1) providing a semiconductor substrate having a shallow p-n junction adjacent its front surface and a layer of an anti-reflective material such as silicon nitride coating that front surface; (2) selectively coating the front surface of the anti-reflective layer with a paste or ink which contains silver particles and a glass frit so that the coating forms an array pattern of narrow, elongate, parallel fingers; (3) heating the substrate to a temperature in the range of 750 to 850 degrees C. for a time sufficient to rapidly and efficiently cause the silver/glass frit coating to penetrate the anti-reflective coating and form an ohmic contact on the front surface of the semiconductor substrate; and (4) selectively coating the front surface of the anti-reflective layer with a paste or ink of an epoxy or other conductive material which will adhere to the anti-reflective layer so that the coating forms at least one bus bar displaced from the front surface of the semiconductor substrate at right angles to the fingers and in reliable, low resistance electrical contact therewith.

The novel method may be practiced with a silicon solar cell substrate which already has a rear ohmic contact affixed thereto, or the latter contact may be formed after the front surface configuration is formed.

It will be understood that the steps of the cell-fabricating method will vary according to the material selected for the bus bar. Thus, if a paste or ink containing metallic particles and a glass frit is chosen for the bus bars, the composition may be varied from the composition of the material used to form the fingers such that under the same firing conditions the fingers will penetrate the anti-reflective coating and make an ohmic contact with the semiconductor, while the bus bar will only partially penetrate through the anti-reflective layer and will not make an ohmic contact with the semiconductor substrate. In that alternative, step (4) above would precede step (3). If adhesion to the anti-reflective layer is to be utilized rather than penetration thereof to hold the bus bar, then the paste, ink or epoxy may be coated onto the fired solar cell in any convenient manner, e.g. direct write, pad print, screen print or the like, after the fingers have been printed and fired.

BRIEF DESCRIPTION OF THE DRAWINGS

For a more complete understanding of the structure and method of fabrication of a solar cell in accordance with the present invention, reference should be made to the following detailed description of a preferred embodiment of the improved solar cell and the preferred method of its manufacture and to the accompanying drawings. Throughout the drawings, like reference numerals are utilized to refer to like elements. It also should be understood that the drawings are intended to be illustrative only. The thicknesses and depths of the various layers, coatings and regions are neither shown to scale nor shown exactly in accordance with their relative proportions, for convenience and clarity of illustration. Similarly, cross-sectional views are shown without cross hatching for clarity. More particularly, the various drawing figures may be briefly characterized as follows.

DETAILED DESCRIPTION OF A PREFERRED EMBODIMENT

Figure 1:
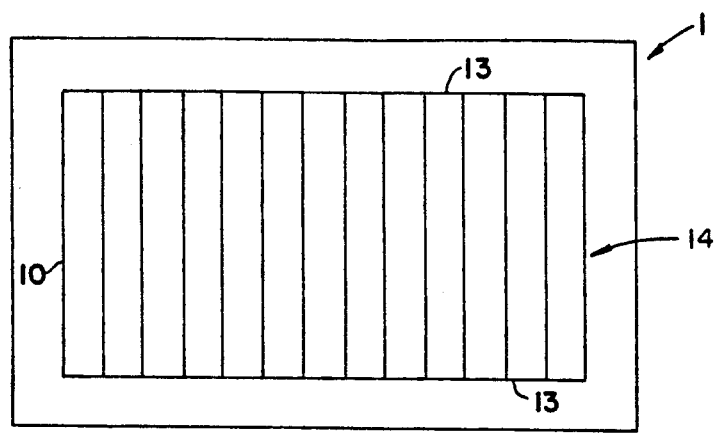
FIG. 1 is a top elevational plan view of an improved solar cell in accordance with this invention.
Figure 2:
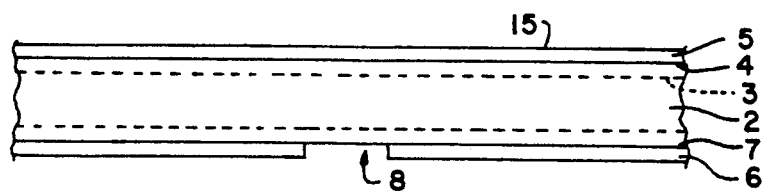
FIG. 2 is a diagramatic cross-sectional side view of a portion of a semiconductor substrate having a shallow p-n junction (indicated by dotted lines) adjacent its front surface, a coating of anti-reflective material on its front surface, and an electrical contact affixed to its rear surface.
Figure 5:
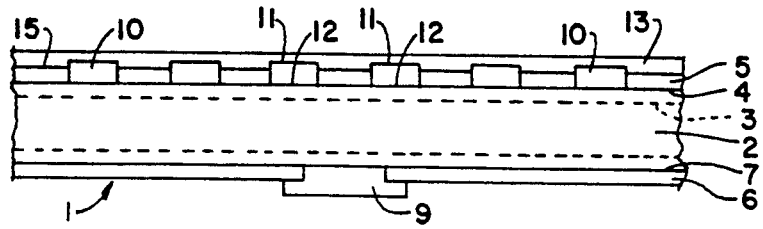

Referring now to the drawings, and particularly to FIGS. 1 and 5, there is shown an improved solar cell generally indicated at 1 in accordance with the invention. As is well known in the art, the solar cell includes a semiconductor substrate 2 having a shallow p-n junction 3 located adjacent to its front surface 4. An anti-reflective ("AR") coating 5 is located on the front surface 4 of the semiconductor substrate 2. A rear electrode 6 is affixed in a low resistance electrical and mechanical contact to the rear surface 7 of the semiconductor substrate.

In the preferred embodiment, rear electrode 6 covers all of the rear surface 7 of the semiconductor substrate 2 except a small area adjacent the periphery of the rear surface 7. Rear electrode 6 also defines a preselected number of apertures, representatively shown at 8, therethrough at predetermined spaced locations. A highly conductive pad 9 fills each of the apertures 8 so as to form an ohmic contact with the semiconductor substrate. The pads 9 also contact the sides of the apertures 8 and overlap the rear electrode 6 in the area immediately adjacent the respective apertures. The material of the pads 9 is chosen so as to facilitate the formation of low resistance electrical contacts with the rear electrode 6 by tabbing means (not shown) for the connection of the solar cell mechanically and electrically to other cells or into an external electrical circuit. In one preferred case, the rear electrode 6 is formed of an aluminum material while the pads 9 are formed of a silver material. This selection of materials facilitates the formation of soldered low electrical resistance contacts with the rear electrode 6 while at the same time taking advantage of the low cost of aluminum in comparison to the high cost of silver.

Figure 3:
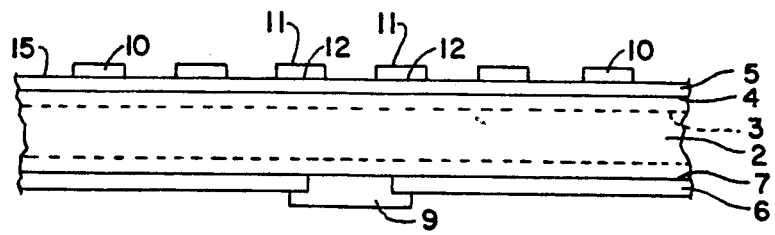
FIG. 3 is a diagramatic view similar to that of FIG. 2 showing the disposition of a conductive paste or ink within apertures in the electrical contact affixed to the rear surface of the semiconductor substrate, and a representative location of an array of narrow, elongate, parallel fingers of a conductive ink or paste containing glass frit on the front surface of the coating of anti-reflective material.
Figure 4:
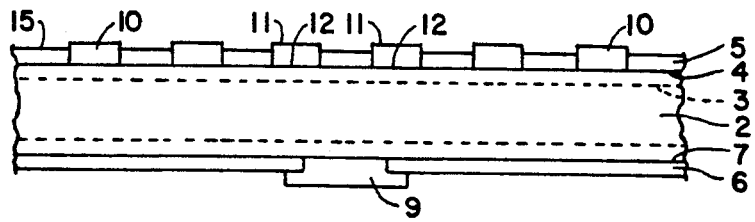
FIG. 4 is a diagramatic view similar to FIG. 3 showing the relative positions of the elements shown in FIG. 3 subsequent to heating in accordance with the method of the invention; and, FIG. 5 is a diagramatic view similar to FIG. 4 showing the disposition of a bus bar on the front surface of the anti-reflective coating in electrical contact with each of the fingers of the array.

The front electrode grid configuration, generally indicated at 14, includes an array of narrow, elongate, parallel, highly conductive fingers 10 each having a front surface 11 and a rear surface 12 (FIG. 3). Each of the fingers 10 extends through the anti-reflective coating 5 such that its rear surface 12 is in adherent and low resistance electrical contact with the front surface 4 of the semiconductor substrate 2. Preferably, the fingers 10 each have a height which is equal to, or slightly greater than the thickness of the anti-reflective coating 5 (see FIG. 4). It has been found that silver based materials are particularly well suited for the formation of these electrodes.

The bus bar portion(s) 13 of the front electrode grid is (are) located on the front surface 15 of the anti-reflective coating 5 at right angles to the fingers 10. The bus bar 13 is formed of an electrically conductive material which makes a reliable adherent bond with the front surface 15 of the anti-reflective coating 5 and a low resistance electrical contact with at least the front surface 11 of each of the fingers 10 at the points where the vertical plane containing the bus bar intersects the vertical planes containing each of the fingers 10.

As will become more apparent below, the material of the bus bar may be either the same or similar to the material of the fingers, or alternatively may be substantially different therefrom. This is a substantial departure from the configuration of the front electrode grid of current solar cells wherein the fingers and bus bars generally are (a) made of the same materials, (b) formed during the same processing steps, and (c) both in direct adherent and ohmic contact with the front surface of the underlying semiconductor substrate. It will be understood by those skilled in the art, however, that the fingers and bus bars of the grid pattern of the front contact of a solar cell serve different primary purposes, and are subject to different requirements. The fingers collect the current from the semiconductor, and conduct the current so collected to the bus bar(s). Therefore, the fingers must have good conductivity and form a good, reliable, and low resistivity electrical contact with the front surface of the semiconductor substrate. The bus bar(s), on the other hand, conduct the collected current received from the fingers to tabbing material (not shown) utilized to interconnect the individual cells into modules or otherwise connect the cell to an external electrical circuit. Therefore, the bus bars must display good adherence to the solar cell, and provide a conductive path from every finger to the tabbing material. From this basis, Applicants discovered that the bus bars need not form an intimate contact with the front surface of the semiconductor in order to function in the desired manner. Some de minimus quantity of the total current collection capability of the front electrode provided by the bus bars in the gaps between the fingers is lost by the removal of the bus bars from the vicinity of the semiconductor, but the gains of so doing are substantial. Not only is the metal-semiconductor interface area reduced by approximately 40%, thereby reducing the portion of emitter saturation current density caused by recombination at the metal/semiconductor interface, but also the bus bars can be made of materials different from (and less costly than) the material of the fingers. The potential benefits in terms of improved solar cell efficiency and manufacturing material costs alone render the novel electrode configuration described in detail above significant.

A preferred method of manufacturing a completed improved solar cell in accordance with this invention will now be described with particular reference to FIGS. 2 through 5. This method includes the following steps: (1) providing a silicon substrate 2 having a shallow p-n junction 3 adjacent its front surface 4 and a thin layer of silicon nitride 5 on its front surface 4; (2) coating the rear surface 7 of the silicon substrate 2 with an aluminum paste such that the paste covers all but a small area adjacent the periphery of the rear surface and a plurality of small predetermined spaced areas in the central portion of the rear surface 6; (3) drying the aluminum paste subsequent to its application to the rear surface of the silicon substrate, and thereafter heating the silicon substrate to rapidly and efficiently cause the aluminum to form a rear electrical contact 6 alloyed to the rear surface 7 of the silicon substrate 2 (the resulting structure upon the completion of steps 1-3 will be substantially as illustratively shown in FIG. 2); (4) coating the small predetermined spaced areas on the rear surface with an ink or paste containing silver particles such that the paste or ink fills the apertures 8 defined by the adjacent aluminum contact 6 and overlies the rear surface of the aluminum contact adjacent to the periphery of each of the apertures 8; (5) coating the front surface of the silicon nitride layer 5 with a paste or ink containing silver particles and a glass frit so as to form an array of narrow, elongate, parallel fingers 10 on the silicon nitride (the structure at this stage is illustratively shown in FIG. 3); (6) drying the silver containing pastes subsequent to their application to the front and rear surfaces of the silicon substrate, and thereafter heating the substrate to a temperature of 750-850 degrees C. for a period of time sufficient to cause (a) the metal and frit components of the paste coating the silicon nitride layer to penetrate that layer and form an adherent and conductive contact on the front surface 4 of the semiconductor substrate 2, and (b) the silver containing ink or paste deposited in the small predetermined spaced areas on the rear surface of the silicon substrate to form a reliable, low resistance electrical contact with both the silicon substrate and the aluminum adjacent thereto (the resulting structure is shown illustratively in FIG. 4); and (7) coating the front surface 15 of the resulting structure with a conductive epoxy containing silver particles so as to form at least one bus bar 13 (FIG. 5) extending at right angles to the fingers 10 of the array previously deposited thereon, and thereafter curing the epoxy in an appropriate manner (e.g., by the application of heat or otherwise) so that the the epoxy forms a reliable, low resistance electrical contact with each of the fingers of the array. The completed structure is illustratively shown in FIG. 5. Thereafter the substrate may be further processed, e.g., to prepare it for connection to an electrical circuit.

Generally, the silver ink used to form the fingers ought to contain between 45 and 80 wt. % metal particles; 1 to 5 wt. % of a glass frit; and the remainder an organic vehicle. One such ink which has been found suitable is Ferro Conductrox TM 3349 paste manufactured by Ferro Electronics Materials Division of Santa Barbara, Calif. The composition of that ink is believed to be as follows: 45-80 wt. % silver particles; 1-5 wt. % lead borosilicate glass frit; 10-30 wt. % diethyleneglycol monobutylether; and, 1-5 wt. % ethylene glycol monobutylether ether.

With the exception of the formation of the bus bar portions of the front grid-shaped electrode, the foregoing method is generally similar to the method described in detail in U.S. patent application Ser. No. 07/607,883, filed on Nov. 1, 1990 by Jack I. Hanoka, entitled "Method for Fabricating Contacts for Solar Cells", which is a continuation-in-part of U.S. patent application No. 205304 referred to above. Both of these applications are presently assigned to the assignee of this application. They are each hereby specifically incorporated by reference into this description. The details of the construction of the rear electrode 6 form no part of this invention other than as a portion of the best mode of practicing the invention presently known to the Applicants. Applicants' invention resides in the configuration, composition, and method of formation of the bus bar portion of the front contact of a solar cell.

The following example further exemplifies a preferred article and mode of manufacturing same contemplated by the present invention and includes empirical test results verifying the improvement provided.

EXAMPLE

Two groups of four inch square EFG-grown silicon substrates were provided. Care was taken to assure that sister substrates in each group were contiguously grown, and to assure that sister substrates received nearly identical time/temperature profiles in the diffusion furnace and identical dopant flux from the same solid source. The average difference in resistance between the front and rear surfaces of the respective pairs of sister substrates was measured to be only 0.08 ohms. The sister substrates of the respective groups, therefore, were considered to be substantially the same both in terms of crystalline structure, and in terms of the nature of the shallow P-N junction formed approximately 6,000 Angstroms below the front surface of each of the substrates. All of the substrates were coated on their front surfaces with a layer of silicon nitride approximately 800 Angstroms thick. In addition, all of the substrates had substantially identical aluminum contacts formed on their rear surfaces by coating the rear surface with an aluminum containing paste in the desired pattern and heating the substrate so as to alloy the aluminum to the rear surface of the silicon substrate.

The sister substrates were then divided into two groups—one a control and the other experimental. An ink containing both silver and glass frit particles manufactured by Ferro Electronics Materials Division under the designation No. 3349 was then applied to the front surface of the silicon nitride coated substrate by a direct write technique. On the control group substrates the pattern formed on the front surface by the ink was a grid including an array of narrow, elongate, parallel fingers and a pair of bus bars extending across the finger array at right angles to the fingers. On the experimental group, the pattern formed consisted only of an array of narrow, elongate, parallel fingers. Silver ink pads also were formed in the apertures present in the aluminum rear surface contact using the said Ferro Conductrox TM 3349 ink. The ink layers were dried, and thereafter fired in an oven at a temperature of about 800 degrees C. for a period of about 10 seconds so that the ink on the front side of the substrates dissolved the underlying silicon nitride and made a secure adherent and low resistance contact with the front surface of the silicon substrate.

The experimental group was then returned to the direct write processing facility where a coating of silver epoxy paste manufactured by AI Technology under the designation No. ME8450 was applied in the pattern of a bus bars extending across the array of fired fingers at right angles thereto. It is believed that the composition of the ME8450 epoxy material is as follows: 20 wt. % silver particles; 70 wt. % epoxy resin; and 10 wt. % other material. The wet epoxy was thereafter cured in an oven at 150 degrees C. for a hour. Sister substrates from the control and experimental groups displaying less than 1 mA/cm$^2$ leakage currents were then tested.

The results of these tests revealed that for the sister substrate pairs tested, the average open circuit voltage of the experimental group (having the front contact configuration of the present invention) was an average of 2 millivolts greater than the open circuit voltage of the control group (having the conventional front grid pattern electrode entirely in contact with the front surface of the silicon substrate). The average efficiency of the experimental group also was greater than that of the control group by about 0.1 mW/cm$^2$, as the fill factor also improved.

Accordingly, it will be understood that the invention contemplates the removal of the bus bar portion of the front grid electrode from intimate contact with the front surface of the semiconductor substrate in a solar cell of the type discussed in detail above. This change in the heretofore accepted configuration of this electrode provides benefits in terms of overall cell efficiency and open circuit voltage. Further, since the material of the bus bar no longer is required to be the same as that of the finger portions of the grid, significant material cost savings are possible in solar cell manufacture without sacrifice in overall cell efficiency. Silver has been found to be the material of choice for the front grid pattern because of its high conductivity and its capability of forming low resistance soldered contact with the tabbing material which is customarily nickel based. Silver inks and pastes are expensive, however, particularly in those cases wherein the silver particles must be combined with glass frit materials in specific ratios in order to assure the formation of acceptable contacts bonded to the front surface of the semiconductor substrate and complete penetration of the anti-reflective layer under processing conditions which will not damage the remainder of the cell. Silver particle-carrying epoxys and inks or pastes including silver particles and glass frit in concentrations (or of types) which will not totally penetrate the anti-reflective coating during processing are acceptable for bus bars formed in accordance with this invention. Further, it is contemplated that those skilled in the art will recognize the utility of other materials for use in the formation of the bus bar portion of the front electrode in view of the foregoing description of this invention.

In view of the foregoing description of a preferred embodiment of this invention, various additional alterations, modifications, variations and obvious substitutions will occur to those skilled in the art. It, therefore, should be understood that the above description of the invention is intended to be illustrative only, and in no way limiting of the scope of the invention. The invention rather should be understood as being limited only by the terms of the appended claims.

We therefore claim:

1. A solar cell comprising:
   a semiconductor substrate having a front surface, a rear surface, and a shallow p-n junction adjacent said front surface;
   a first electrode affixed in mechanical and electrical contact with said rear surface;
   an array of narrow, elongate, second electrodes affixed in mechanical and low resistance electrical contact with said front surface;
   an anti-reflection coating overlying and bonded to said front surface in flanking relation to each of said second electrodes, said anti-reflection coating having a front surface facing away from said substrate; and
   at least one third electrode formed from a paste or an epoxy resin composition that contains conductive metal particles, said third electrode being bonded to said front surface of said anti-reflection coating and extending across said array of second electrodes at an angle to each of said second electrodes, said third electrode being in direct electrical contact with each of said second electrodes and also being spaced from and out of contact with the front surface of said semiconductor substrate by portions of said anti-reflection coating.

2. The solar cell of claim 1 wherein said semiconductor substrate is formed of silicon and said anti-reflection coating is formed of silicon nitride.

3. The solar cell of claim 2 wherein said second electrodes comprise silver particles and a glass matrix.

4. The solar cell of claim 1 wherein said third electrode comprises particles of silver in an epoxy polymer.

5. A solar cell according to claim 1 wherein said third electrode particles of silver in a glass matrix.

6. A method of making a solar cell, comprising:
   (a) providing a semiconductor substrate having a front surface, a rear surface, a shallow p-n junction adjacent said front surface, an anti-reflection coating overlying and bonded to said front surface, and a first electrode in mechanical and electrical contact with said rear surface;
   (b) forming an array of narrow, elongate, and mutually spaced second electrodes on said front surface of said semiconductor substrate such that each of said second electrodes is in mechanically adherent and low resistance electrical contact with said front surface of said semiconductor substrate and is flanked by said anti-reflection coating; and
   (c) affixing at least one elongate third electrode to said front surface of said anti-reflection coating and each of said second electrodes such that said at least one third electrode extends across said array of second electrodes and is displaced from said front surface of said semiconductor substrate by said anti-reflection coating, said third electrode being formed from a first paste or an epoxy resin that contains conductive metal particles.

7. The method of claim 6 wherein said step of forming said array of said second electrodes includes the steps of selectively coating said anti-reflection coating with a second paste or ink containing metallic particles and glass frit in the pattern of the desired array, and heating the semiconductor substrate at a temperature and for a time such that said second paste or ink penetrates said anti-reflection coating and forms an adherent mechanical and low resistance electrical contact with said front surface of said semiconductor substrate.

8. The method of claim 7 wherein said semiconductor substrate is silicon, said anti-reflection coating is silicon nitride, each of said second electrodes comprises a glass matrix and particles of silver dispersed in said glass matrix, and said at least one third electrode comprises particles of silver in a solid epoxy polymer composition.

9. The method of claim 7 wherein the metallic particles contained in said second paste or ink are silver.

10. The method of claim 9 wherein said at least one third electrode comprises particles of silver.

11. The method of claim 7 wherein said second paste or ink is applied to said anti-reflection coating by direct writing means, and said at least one third electrode is formed by coating said anti-reflection coating and said second electrode with a first silver paste or epoxy resin applied by a method selected from the group consisting of screen printing, pad printing, and direct writing.

12. A method according to claim 6 wherein said at least one third electrode is formed by applying a predetermined composition comprising conductive metal particles and an epoxy resin to said anti-reflection coating in intersecting and contacting relation with said second electrodes, and thereafter heating said predetermined composition so as to polymerize said epoxy resin.

13. A method according to claim 12 wherein said predetermined composition comprises particles of silver dispersed in said epoxy resin.

14. A method according to claim 13 wherein said heating step involves heating said predetermined composition to a temperature of about 150 degrees C.

15. A solar cell comprising:

a silicon semiconductor substrate having a front surface, a rear surface, and a shallow p-n junction adjacent said front surface;

an anti-reflection coating of silicon nitride on said front surface, said anti-reflection coating having a front surface facing away from said substrate;

a first aluminum-coating electrode affixed in mechanical and electrical contact with said rear surface;

an array of narrow, elongate, substantially parallel second electrodes extending through said anti-reflection coating and affixed in mechanical and low resistance electrical contact with said front surface of said substrate, said second electrodes comprising silver particles in a glass matrix; and at least one third electrode overlying said front surface of said anti-reflection coating and extending across said array of second electrodes in spaced and non-contacting relation with said front surface of said substrate, said at least one third electrode comprising silver particles dispersed in an epoxy matrix and being bonded to said anti-reflection coating and said second electrodes.

16. A solar cell comprising:

a semiconductor substrate having a front surface, a rear surface, and a shallow p-n junction adjacent said front surface;

a first electrode affixed in mechanical and electrical contact with said rear surface;

an array of narrow, elongate, second electrodes affixed in mechanical and low resistance electrical contact with said front surface;

an anti-reflection coating overlying and bonded to said front surface in flanking relation to each of said second electrodes, said anti-reflection coating having a front surface facing away from said substrate; and at least one third electrode comprising conductive metal particles in a solid epoxy polymer material, said third electrode being bonded to said front surface of said anti-reflection coating and extending across said array of second electrodes at an angle to each of said second electrodes, said third electrode being in direct electrical contact with each of said second electrodes and also being spaced from and out of contact with the front surface of said semiconductor substrate by portions of said anti-reflection coating.

17. A solar cell according to claim 16 wherein said semiconductor substrate is silicon.

18. A solar cell according to claim 17 wherein said anti-reflection coating is formed of silicon nitride.

19. The solar cell of claim 16 wherein said conductive metal particles are particles of silver.

20. A method of making a solar cell, comprising:
   (a) providing a semiconductor substrate having a front surface, a rear surface, a shallow p-n junction adjacent said front surface, an anti-reflection coating overlying and bonded to said front surface, and a first electrode in mechanical and electrical contact with said rear surface;
   (b) forming an array of narrow, elongate, and mutually spaced second electrodes on said front surface of said semiconductor substrate such that each of said second electrodes is in mechanically adherent and low resistance electrical contact with said front surface of said semiconductor substrate and is flanked by said anti-reflection coating; and (c) affixing at least one elongate third electrode to said front surface of said anti-reflection coating and each of said second electrodes such that said at least one third electrode extends across said array of second electrodes and is displaced from said front surface of said semiconductor substrate by said anti-reflection coating, said third electrode being affixed to said anti-reflection coating by selectively coating said anti-reflection coating and portions of said array of second electrodes with an epoxy material containing conductive metal particles in the desired pattern, and thereafter curing the epoxy material.

21. The method of claim 20 wherein said epoxy material contains silver particles.

* * * * *

UNITED STATES PATENT AND TRADEMARK OFFICE
CERTIFICATE OF CORRECTION

PATENT NO. : 5,279,682
DATED : January 18, 1994
INVENTOR(S) : Fritz Wald et al

It is certified that error appears in the above-indentified patent and that said Letters Patent is hereby corrected as shown below:

Claim 5, column 11, line 4, the word "comprises" should be inserted after the word -- electrode --;

Claim 15, column 12, line 7, the term "aluminum-coating" should be -- aluminum-containing --.

Signed and Sealed this

Twenty-fourth Day of May, 1994

Attest:

BRUCE LEHMAN

Attesting Officer

Commissioner of Patents and Trademarks